United States Patent
De Lorenzo et al.

(10) Patent No.: US 6,493,233 B1
(45) Date of Patent: Dec. 10, 2002

(54) PCB-TO-CHASSIS MOUNTING SCHEMES

(75) Inventors: David S. De Lorenzo, Olympia, WA (US); Casey R. Winkel, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/934,871

(22) Filed: Aug. 21, 2001

(51) Int. Cl.[7] ............................. H05K 7/14; H05K 1/14; H01B 17/14
(52) U.S. Cl. ................ 361/752; 361/758; 361/759; 361/742; 361/736; 174/138 G
(58) Field of Search .................... 361/752, 758, 361/767, 742, 796, 801, 804, 807–809, 799, 736, 759; 174/51, 138 G

(56) References Cited

U.S. PATENT DOCUMENTS

| | | | | |
|---|---|---|---|---|
| 4,577,402 A | * | 3/1986 | Swanstrom | 29/840 |
| 4,851,614 A | * | 7/1989 | Duncan, Jr. | 174/68.5 |
| 4,969,065 A | * | 11/1990 | Petri | 361/412 |
| 5,414,223 A | * | 5/1995 | Suski et al. | 174/262 |
| 5,550,712 A | * | 8/1996 | Crokett | 361/752 |
| 5,911,329 A | * | 6/1999 | Wark et al. | 211/41.17 |
| 6,262,887 B1 | * | 7/2001 | Lee | 361/683 |
| 6,295,210 B1 | * | 9/2001 | Lanzone et al. | 361/799 |
| 6,347,042 B1 | * | 2/2002 | White | 361/784 |
| 6,347,044 B1 | * | 2/2002 | Won et al. | 361/807 |

OTHER PUBLICATIONS

Cisco Systems, Inc., Installing VPN Encryption Modules in Cisco 2600 and Cisco 3600 Series Routers, 2000, pp. 18–20, Cisco Systems, San Jose.
Accurate Screw Machine Corporation, on line catalog, 2001.
McMaster–Carr, on line catalog, 2001.

* cited by examiner

Primary Examiner—David Martin
Assistant Examiner—Dameon E. Levi
(74) Attorney, Agent, or Firm—Blakely, Sokoloff, Taylor & Zafman LLP

(57) ABSTRACT

A method and assembly for mounting printed circuit boards (PCBs) to a chassis. In one embodiment, a plurality of internally-threaded mounting posts are secured (e.g., press-fit) to the chassis and the PCB includes a plurality of holes into which the mounting posts extend. Each hole includes a pair of keepout pads to isolate internal PCB circuitry (other than ground planes) from electric contact with the assembly components. A threaded faster is used to secure the assembly. In another embodiment, a collar is added to the assembly and the extending portion of the post is elongated such that it extends into the collar, providing additional thread engagement for thinner PCBs. In a third embodiment, hat-section components are secured (e.g., via wave soldering) over respective holes in the PCB. The hat-section component includes a counterbore through which the threaded fastener passes and is sized to receive a portion of a threaded standoff.

12 Claims, 9 Drawing Sheets

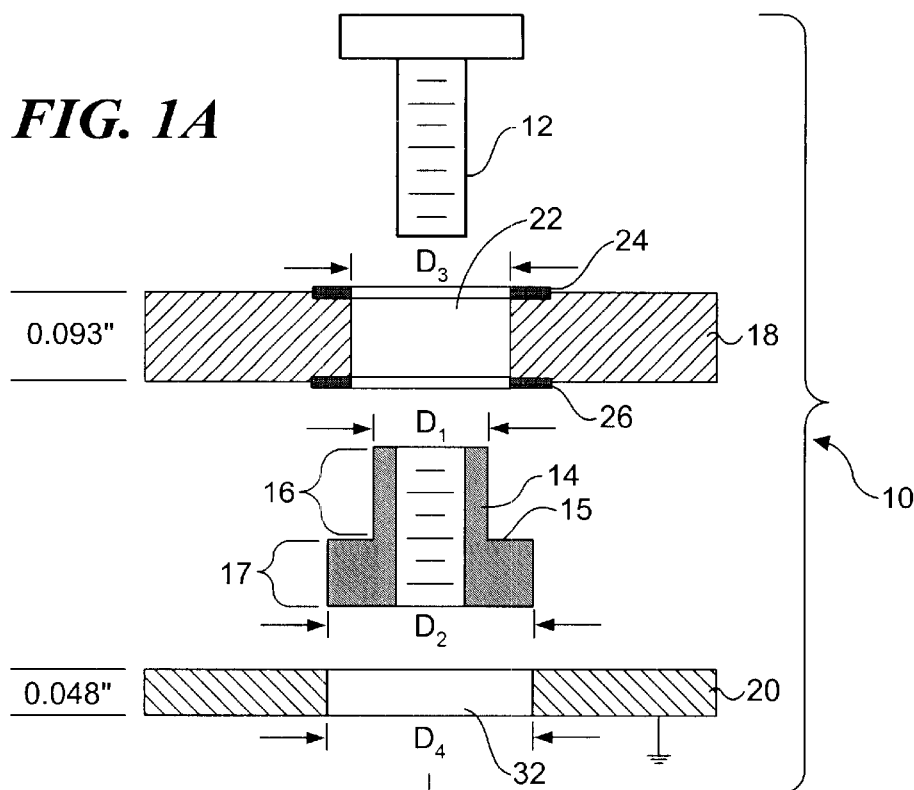
*FIG. 1A*
*FIG. 1B*
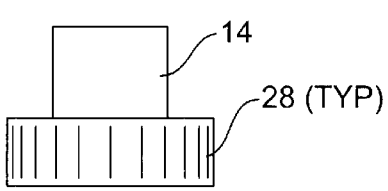
*FIG. 1C*
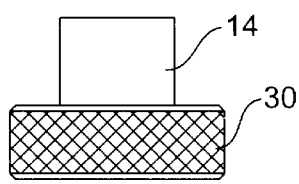
*FIG. 1D*
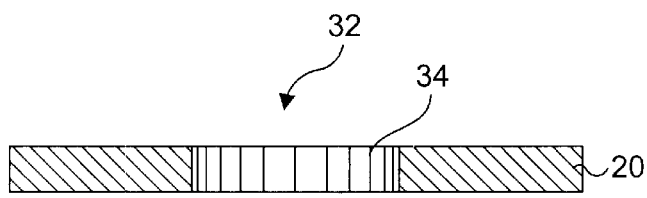
*FIG. 1E*

PCB-TO-CHASSIS MOUNTING SCHEMES

BACKGROUND OF THE INVENTION

1. Field of the Invention

The present invention concerns computer systems in general, and techniques for mounting PCBs to computer system chassis in particular.

2. Background Information

Mounting holes are provided in printed circuit boards (PCBs) to secure the PCBs to the computer system chassis they are mounted in. Typically, a PCB will be secured to it chassis using threaded fasteners, which are inserted into threaded holes or press-in threaded barrels (i.e., standoffs, such as Keenserts) disposed in the chassis. Generally, a manufacturer will specify a minimum separation dimension between the PCB and the chassis for the followings reasons: 1) to provide room for back-side component placement; 2) to provide a gap between protruding leads and the chassis sheet metal to avoid electrical short circuits; and 3) to provide sufficient engagement between screws and chassis-mounted, press-in threaded barrels.

Recent market demands have led the computer industry to develop computer systems with increased circuit densities. For example, many hardware vendors, such as Intel, Hewlett-Packard, IBM, Compaq, and Dell, offer high-density rack-mounted servers that enable a large number of servers to be housed within a single standardized rack. The chassis for these rack-mounted servers are configured to have a specific form factor that is designed to the standardized rack the servers are to be installed in. In one configuration, an ultra-thin form factor, known as the "1U" form factor, is used. Under the 1U form factor, the chassis height for each server is only 1.75 inches.

In addition to increased circuit density, the components in these computer servers are operating at higher and higher frequencies. As a result, these components generate a large amount of heat, which must be removed from the chassis so that the components do not overheat. Generally, this heat is removed using forced air convection, which transfers the heat from the heat-producing circuit components by using one or more fans that are disposed within or coupled to the chassis to draw air through the chassis. In addition, heat sinks are often mounted to various high-power circuit components, such as CPUs.

In order to provide adequate flow passages and/or room for heat sinks in high-density configurations such as the 1U standard, it is necessary that space utilization is maximized, wherein no or minimal space is wasted. Thus, the distance between the PCB(s) and the chassis need to be accurately controlled. In addition, any mounting scheme that is used should not require changes in the manufacturing techniques used to make the PCBs, such as wave soldering, pick and place insertion, etc.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A is an exploded cross-section view of a PCB-to-chassis mounting assembly according to a first exemplary embodiment of the invention;

FIG. 1B is a cross-section view of the embodiment of FIG. 1A upon assembly;

FIG. 1C is a detail view of the mounting post of the first embodiment that includes a plurality of splines that are deformed during a press-fit operation so as to engage the inner surface of a hole in the chasses;

FIG. 1D is a detail view of the mounting post of the first embodiment that includes a knurled surface area that is deformed during a press-fit operation so as to engage the inner surface of a hole in the chasses;

FIG. 1E is a cross-section view of a chassis hole in which a plurality of splines are defined that are deformed during a press-fit operation so as to engage major diameter of the mounting post;

DETAILED DESCRIPTION OF THE ILLUSTRATED EMBODIMENTS

Figure 2A:
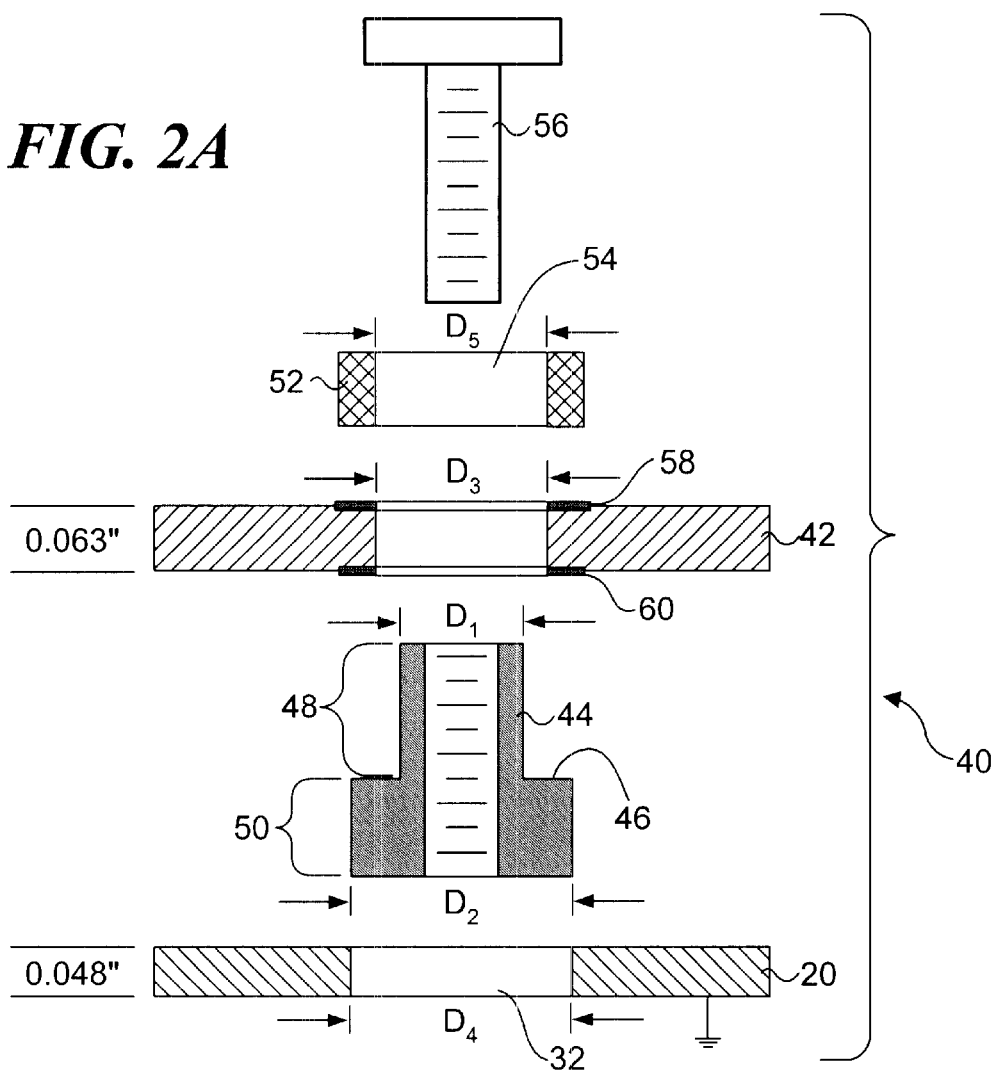
FIG. 2A is an exploded cross-section view of a PCB-to-chassis mounting assembly according to a second exemplary embodiment of the invention.

In the following description, numerous specific details are provided to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A first exemplary embodiment 10 of the present invention is shown in FIGS. 1A and 1B. Embodiment 10 includes a threaded fastener 12 and a press-in internally-threaded mounting post 14, which includes a shoulder 15, a minor diameter portion 16 with a diameter $D_1$ and a major diameter portion 17 having a diameter $D_2$. This, and the following embodiments discussed herein are designed to enable a printed circuit board PCB 18 to be securely mounted to a chassis 20, which generally represents the external housing of a computer system in which PCB 18 is disposed. Typically, chassis 20 will be formed out of sheet metal. Optionally, chassis 18 may made of plastic. In an exemplary configuration depicted in FIGS. 1A and 1B, PCB 18 has a nominal thickness of 0.093 inches and chassis 20 has a nominal thickness of 0.048 inches. It will be understood that the nominal thicknesses of the PCBs and chassis shown in the drawing figures contained herein are merely exemplary, and may be varied without departing from the principles and teachings of the invention.

As depicted in FIG. 1A, PCB board 18 includes a through hole 22 having a diameter $D_3$ that is sized relative to diameter $D_1$ of mounting post 14 to allow for manufacturing tolerances such that each hole 22 in a hole pattern formed in PCB 18 will be positioned to receive a minor diameter portion 16 of a respective mounting post 14. For example, the size of diameter $D_3$ relative to $D_1$ may be determined using well-known manufacturing tolerancing techniques, such as geometric tolerancing.

PCB board 16 also includes a pair of annular "keepout" pads 24 and 26, disposed on opposite sides of the PCB and having a centerline substantially coincident with the centerline of hole 22. Keepout pads 24 and 26 serve two purposes: they are used to ensure (i.e., keepout) that no electrical circuitry (other than ground planes) are electrically coupled to the chassis upon assembly (i.e., "keepout" the mounting assembly components), and to electrically couple PCB 18 to chassis 20 in configurations in which the keepout pads are conductive. In one embodiment, keepout pads 24 and 26 comprise copper cladding or plating having a shape formed through a conventional PCB manufacturing process, such as chemical etching. In addition to an annular configuration, in optional configurations the external shape of pads 24 and 26 may be square, rectangular, oval, triangular, or any other configuration, as long as the external configuration of the keepout pad extends beyond the adjacent area it is in contact with upon assembly. Upon assembly, keepout pad 24 is in contact with the head of threaded fastener 12, while pad 26 is in contact with shoulder 16 of mounting post 14, as shown in FIG. 1B.

In general, mounting post 14 may be secured to chassis 20 using some form of a press-fit. For example, major diameter portion 17 of mounting post 14 may be configured to have a plurality of splines 28 defined thereon (FIG. 1C) or a knurled surface 30 defined thereon (FIG. 1D), wherein the splines or knurled surface are/is deformed when the major diameter portion of the mounting post is pressed into a hole 32 defined in chassis 20 having a diameter D4 that is sized for the press-fit. In one embodiment chassis 20 is made of a steel-based sheet metal and mounting post 14 is made of a softer metal, such as brass. Accordingly, the splines or knurled surface of the brass is easily deformed when the mounting post is pressed into the sheet metal, thereby creating an interference fit engagement between the two parts. Optionally, a plurality of splines 34 may be defined in hole 32 of chassis 20 to engaged the major diameter portion of mounting post 14. In this instance, the splines will deform portions of the outside surface of the softer mounting post adjacent to the splines, creating a localized set of interference fit portions radially arrayed around the periphery of the mounting post.

In instances in which chassis 20 comprises a metal, the chassis will usually be grounded via that computer system's power supply connection. As such, if mounting post 14 is made of a metal, PCB 18 will be grounded via keepout pad 26 and chassis 20, as shown in FIG. 1B. When fastener 12 is metallic, PCB 18 will also be grounded via keepout pad 24.

Figure 2B:
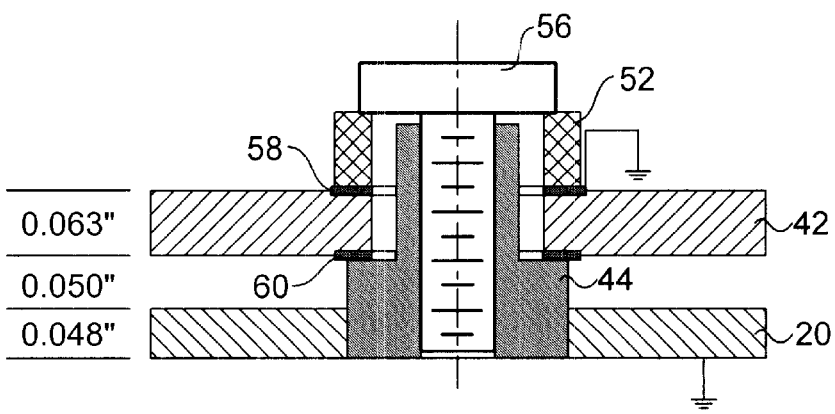
FIG. 2B is a cross-section view of the embodiment of FIG. 2A upon assembly.

A second exemplary embodiment 40 of the present invention is shown in FIGS. 2A–B. This embodiment is tailored to assemblies in which the PCB is thinner than that used in embodiment 10, such as depicted by a PCB 42 that is 0.063 inches thick. The assembly further comprises a mounting post 44 that includes a shoulder 46, an elongated minor diameter portion 48 with a diameter $D_1$, and a major diameter portion 50 with a diameter $D_2$; a collar 52 including a through hole 54 having a diameter $D_5$; and a threaded fastener 56. In a manner similar to embodiment 10, PCB 42 includes a through hole 54 with a diameter $D_3$; and a pair of annular keepout pads 58 and 60.

As shown in the assembled configuration of FIG. 2B, collar 52 is disposed between the head of threaded fastener 56 and keepout pad 58, while keepout pad 60 rests against shoulder 46. In configurations in which collar 52, mounting post 44, and fastener 56 are metallic, keepout pad 58 is electrically connected to chassis 20. In addition, annular pad 60 is electrically connected to chassis 20 when mounting post 44 is metallic, in which case the material used for fastener 56 and collar 52 may or may not be metallic. In some instances, keepout pad 58 and/or keepout pad 60 will be electrically coupled to a ground plane in the PCB, thereby enabling the ground plane to be grounded to the chassis.

Figure 3A:
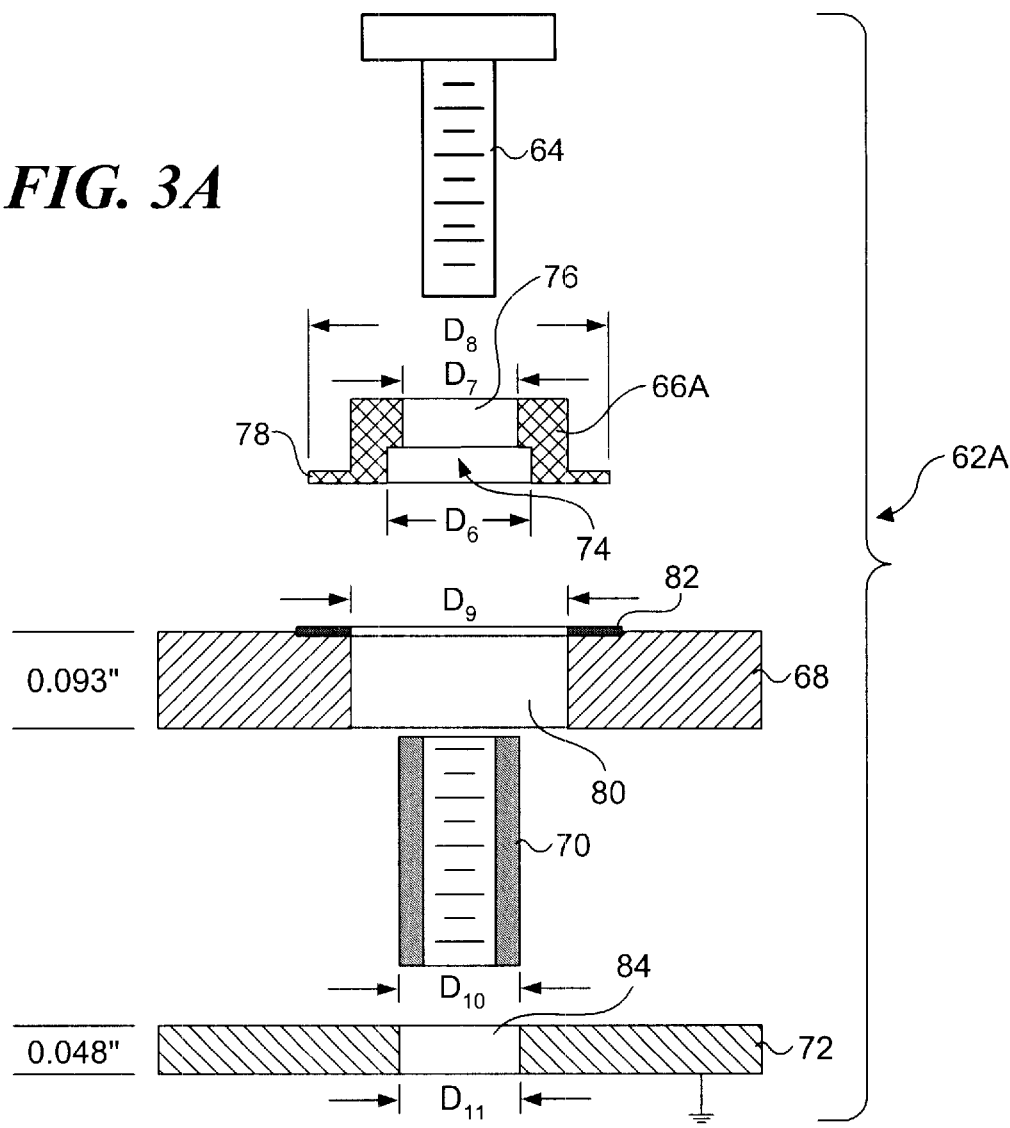
FIG. 3A is an exploded cross-section view of a PCB-to-chassis mounting assembly according to a third exemplary embodiment of the invention.
Figure 3B:
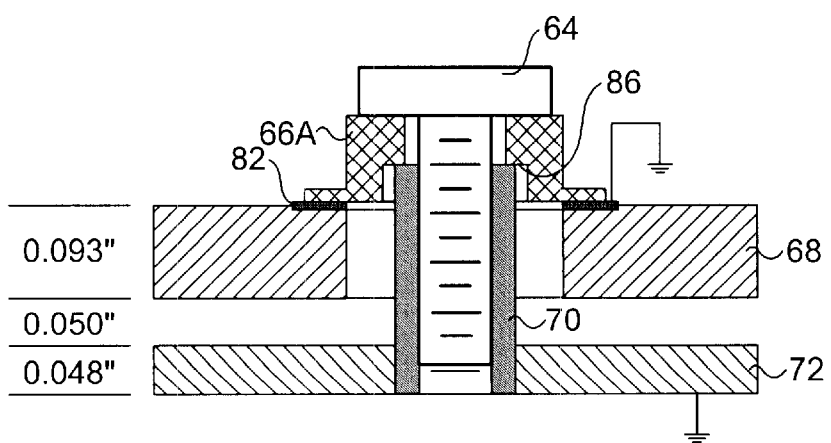
FIG. 3B is a cross-section view of the embodiment of FIG. 3A upon assembly.

A third exemplary embodiment 62A of the invention is shown in FIGS. 3A and 3B. Embodiment 62A includes a threaded fastener 64, a hat-section component 66A, a PCB 68, an internally threaded standoff 70, and a chassis 72. Hat-section component 66 includes a body in which a counterbore 74 having a diameter $D_7$ and a through-hole 76 having a diameter $D_8$ that is sized based on the thread diameter of threaded fastener 64 and manufacturing tolerance considerations is defined. Hat-section component 66 further includes an annular flange 78 having a diameter $D_8$.

PCB 68 includes a through hole 80 and an annular solder pad 82. During an assembly process, flange 78 of hat-section component 66A is soldered to PCB 68 by applying solder to solder pad 82. In one embodiment, hat-section component 66A is placed on top of annular solder pad 82 using a pick and place machine and then a wave soldering process is performed by which flange 78 is soldered to PCB 68. Optionally, the hat-section components may be soldered using other PCB manufacturing techniques that are well-known in the art.

In a separate manufacturing process, threaded standoff 70 is press-fit into a hole 84 disposed in chassis 72. In a manner similar to that described above for mounting post 14, threaded standoff 70 may include a plurality of splines or a knurled surface disposed toward the bottom of the component (not shown), wherein the splines or knurled surface is used to facilitate an interference fit achieved during a press-fit operation.

As shown in FIG. 3B, hat-section component 66A is disposed between the head of threaded fastener 64 and the upper surface of PCB 68. More specifically, the underside of the fastener head is in contact with the top of the hat-section component, while a top portion of threaded standoff 70 is in contact with a shoulder 86 of the counterbore defined in the hat-section component. As a result, when threaded standoff 70 and hat-section component 66A are metallic, PCB 68 is electrically connected to chassis 72.

Figure 4A:
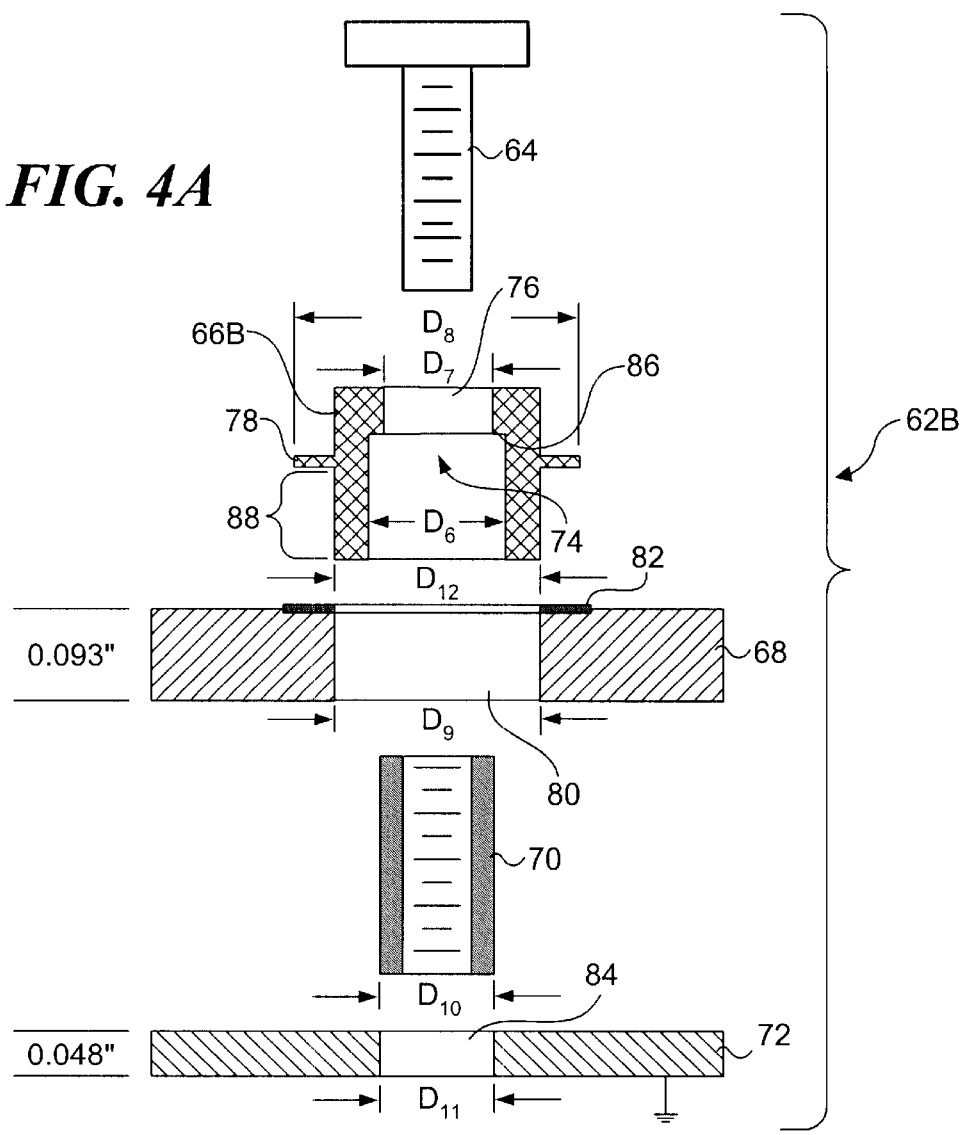
FIG. 4A is an exploded cross-section view of a variation of the third embodiment in which a skirt is added to the hat-section component.
Figure 4B:
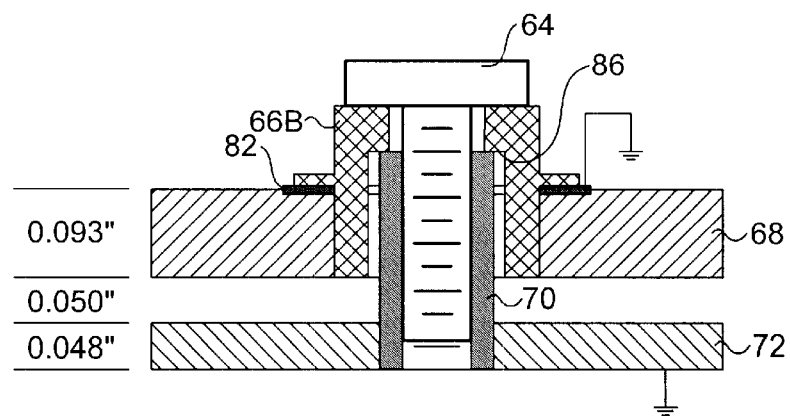
FIG. 4B is a cross-section view of the embodiment of FIG. 3A upon assembly.

An alternative configuration 62B of the third embodiment is shown in FIGS. 4A and 4B. Configuration 62B is substantially similar to embodiment 62A, except that hat-section component 66A is replaced by a skirted hat-section component 66B. Skirted hat-section component 66B includes the further addition of a skirt 88 disposed toward the bottom of the component. Skirt 88 has a diameter $D_{12}$ that is adapted to fit in through hole 80 of PCB 68. Adding the skirt to the hat-section component provides two advantages: first, the skirt serves as a means for aligning skirted hat-section component 66B with through hole 80, which stabilizes the location of skirted hat-section component during the soldering process. Furthermore, the skirt functions as a barrier that ensures isolation of PCB 68 from threaded standoff 70.

Figure 5:
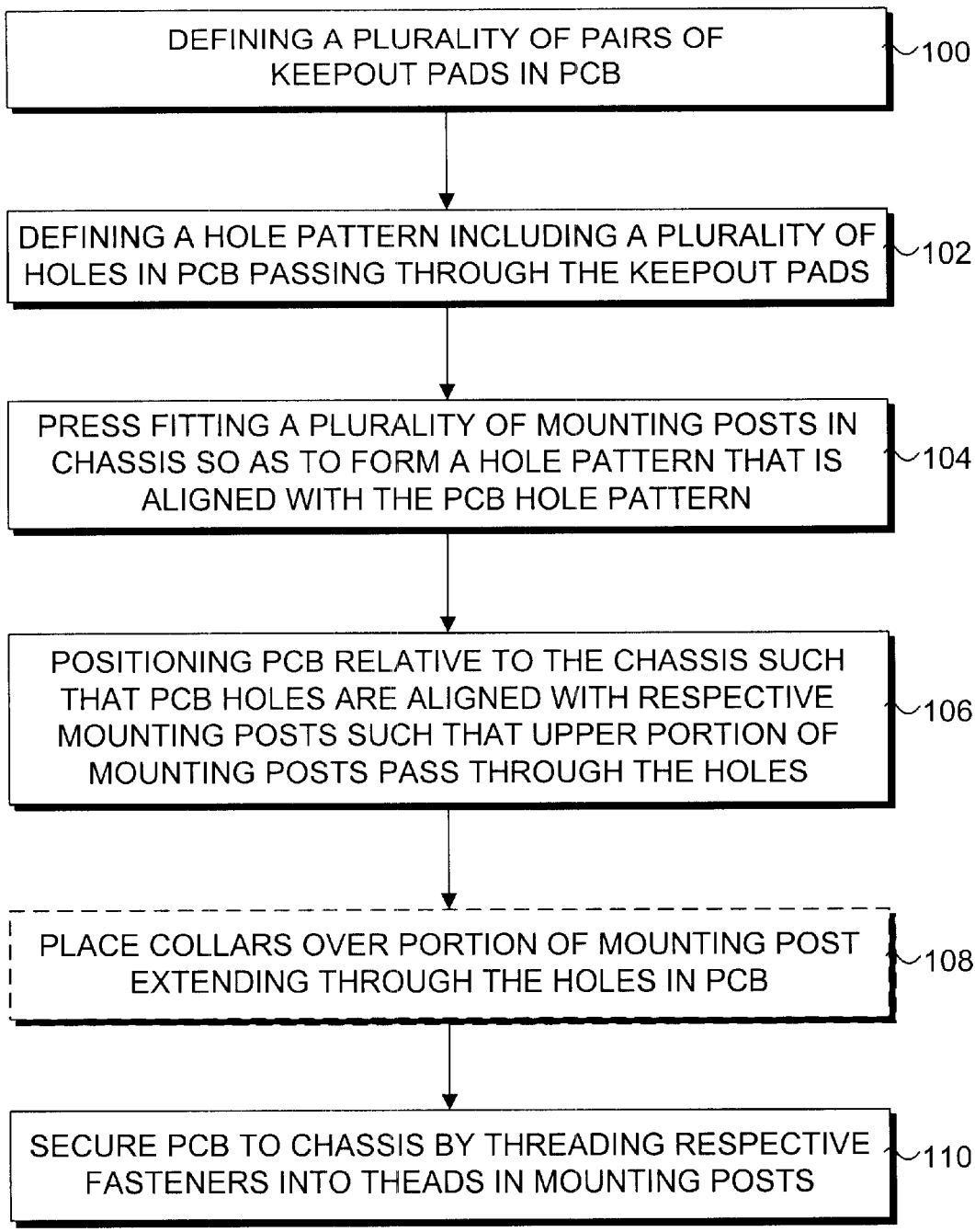
FIG. 5 is a flowchart for illustrating an assembly process corresponding to the first and second exemplary embodiments of the invention.
Figure 6:
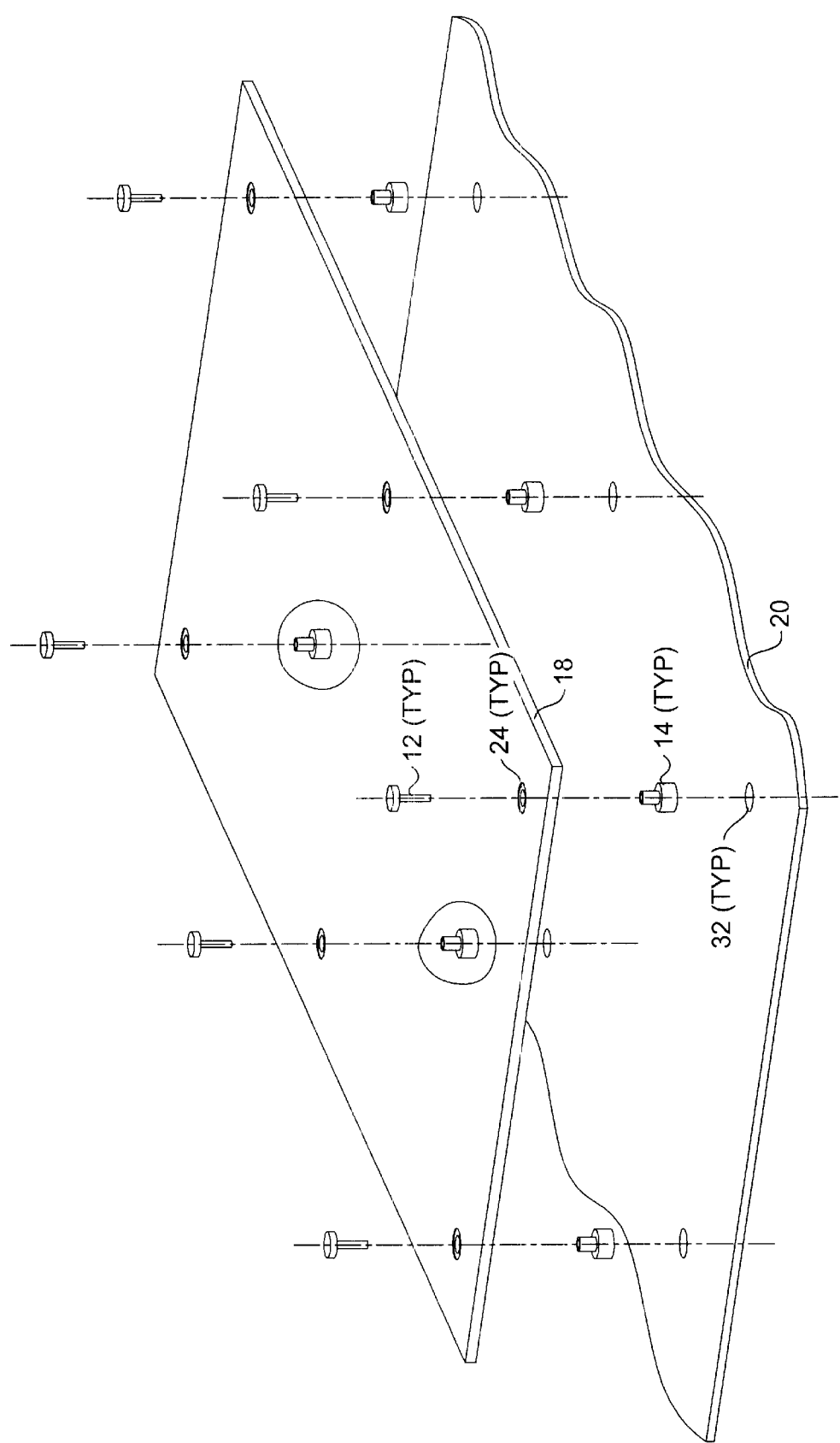
FIG. 6 is an exploded assembly view illustrating the assembly components of the first exemplary embodiment of the invention.
Figure 7:
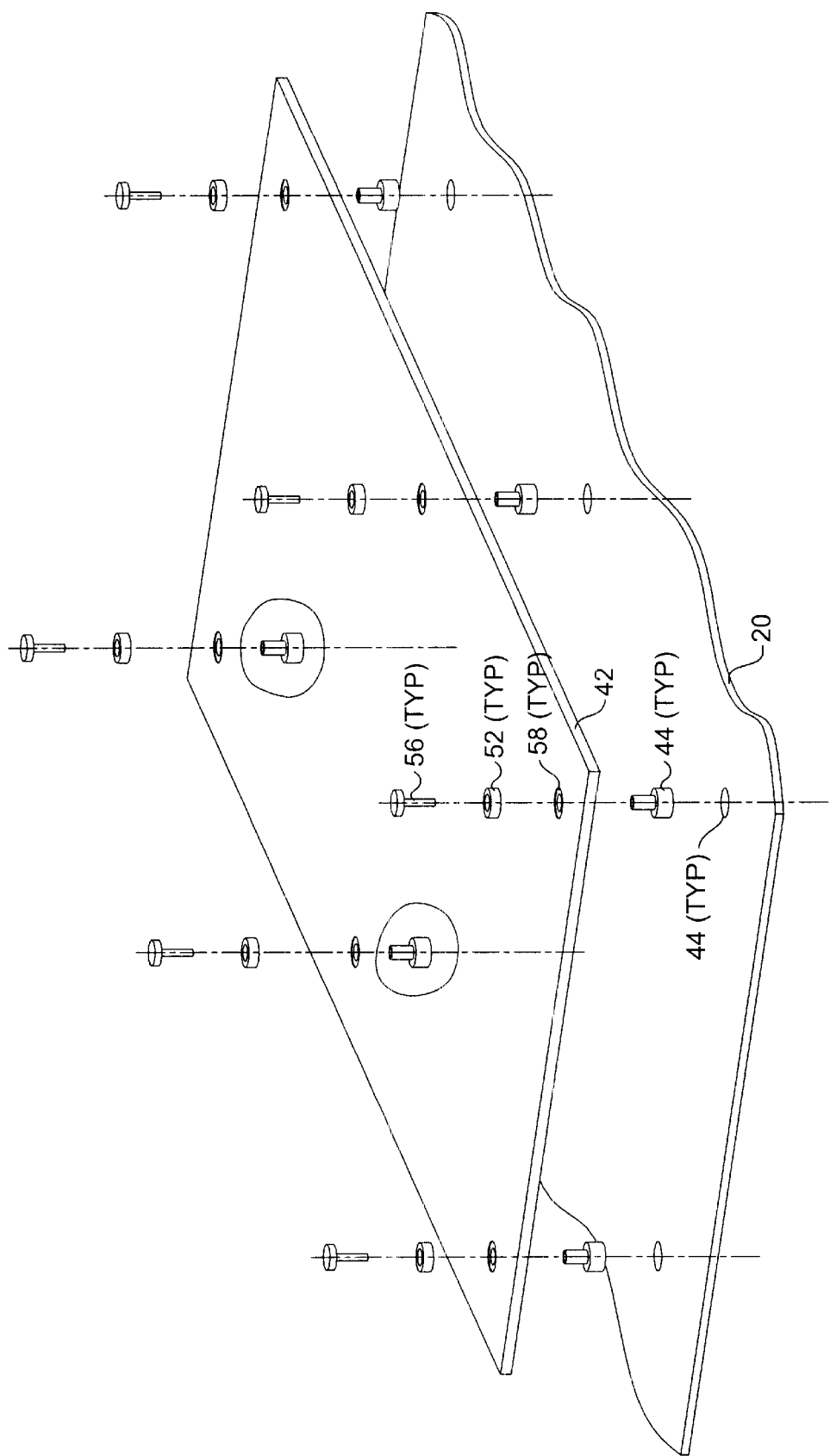
FIG. 7 is an exploded assembly view illustrating the assembly components of the second exemplary embodiment of the invention.

With reference the flowchart of FIG. 5, and FIGS. 6 and 7, PCB's may be assembled to computer system chassis using the mounting schemes of embodiments 10 and 40 in the following manner. In a block 100, a plurality of pairs of keepout pads are defined in the PCB. Keepout pads may be produced using common PCB manufacturing methods that are well-known in the art. For example, this may typically be done using an appropriate mask and chemical etchant(s) that are used to remove selective portions of a copper layer disposed on a blank PCB.

Next, in a block 102, a plurality of holes passing through respective pairs of keepout pads are defined in the PCB to form a hole pattern. In one embodiment, each of the keepout pads originally comprises a circular shape that is drilled through to form an annular configuration.

In a block 104, a plurality of mounting posts are secured to the chassis to form a hole pattern that is adapted to align with the hole pattern in the PCB. In one embodiment, major diameter portions 17 and 50 of mounting posts 14 or 44, respectively, include a knurled surface 30 or a splined surface 28 portion that is press fit into appropriately-sized holes defined in chassis 20.

The PCB is then assembled to the chassis by positioning the PCB in such that the holes in the PCB are aligned with respective mounting posts and the upper portion (i.e. the minor diameter portion) of the mounting post passes into and through the PCB holes, as provided by a block 106. In embodiment 40, collars 52 are placed over the portion of the respective mounting posts that extend through the PCB holes in a block 108. The PCB is then secured to the chassis by threading respective fasteners into the internal threads in the mounting posts in a block 110.

Figure 8:
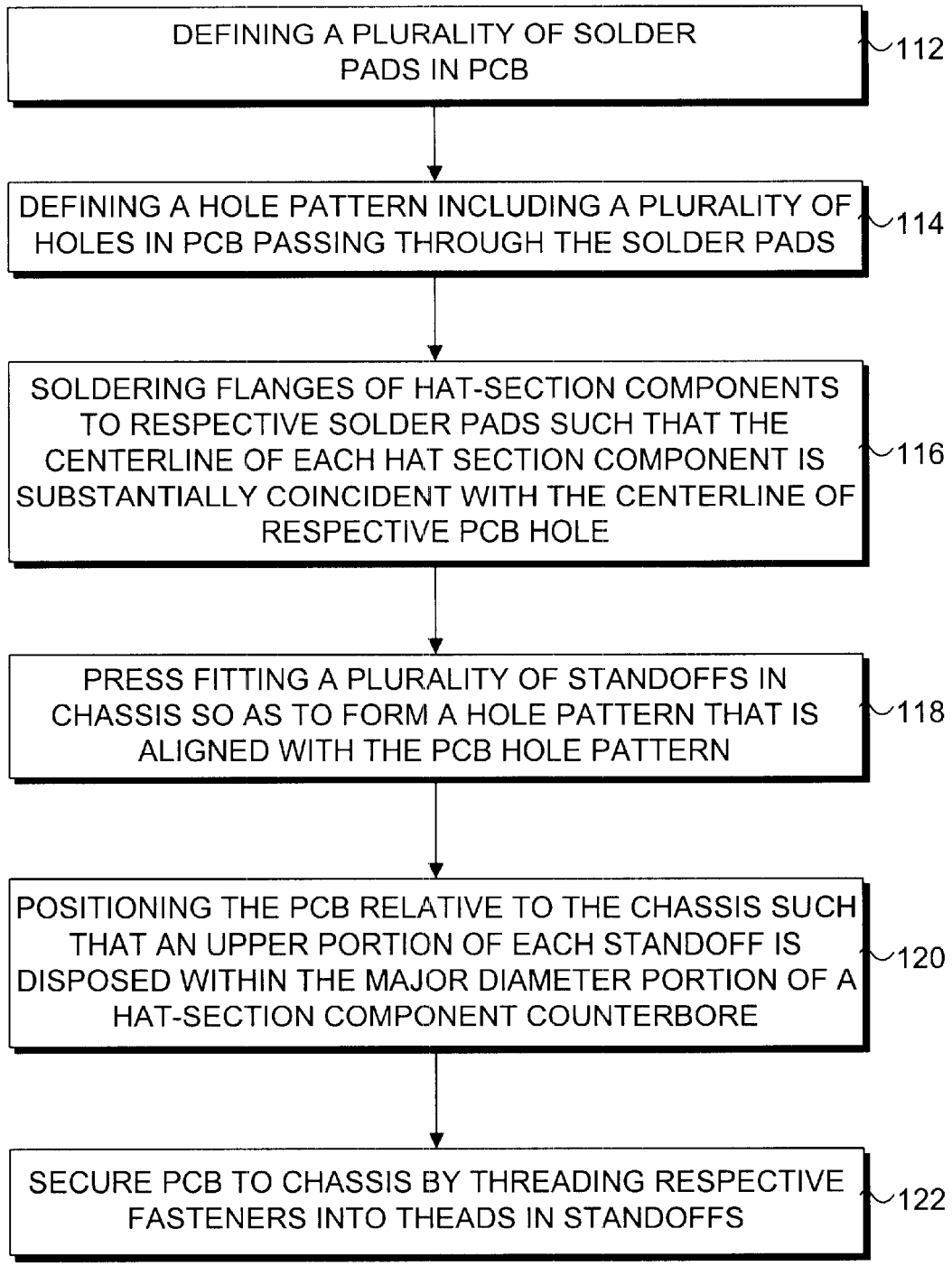
FIG. 8 is a flowchart for illustrating an assembly process corresponding to the third exemplary embodiment of the invention.
Figure 9:
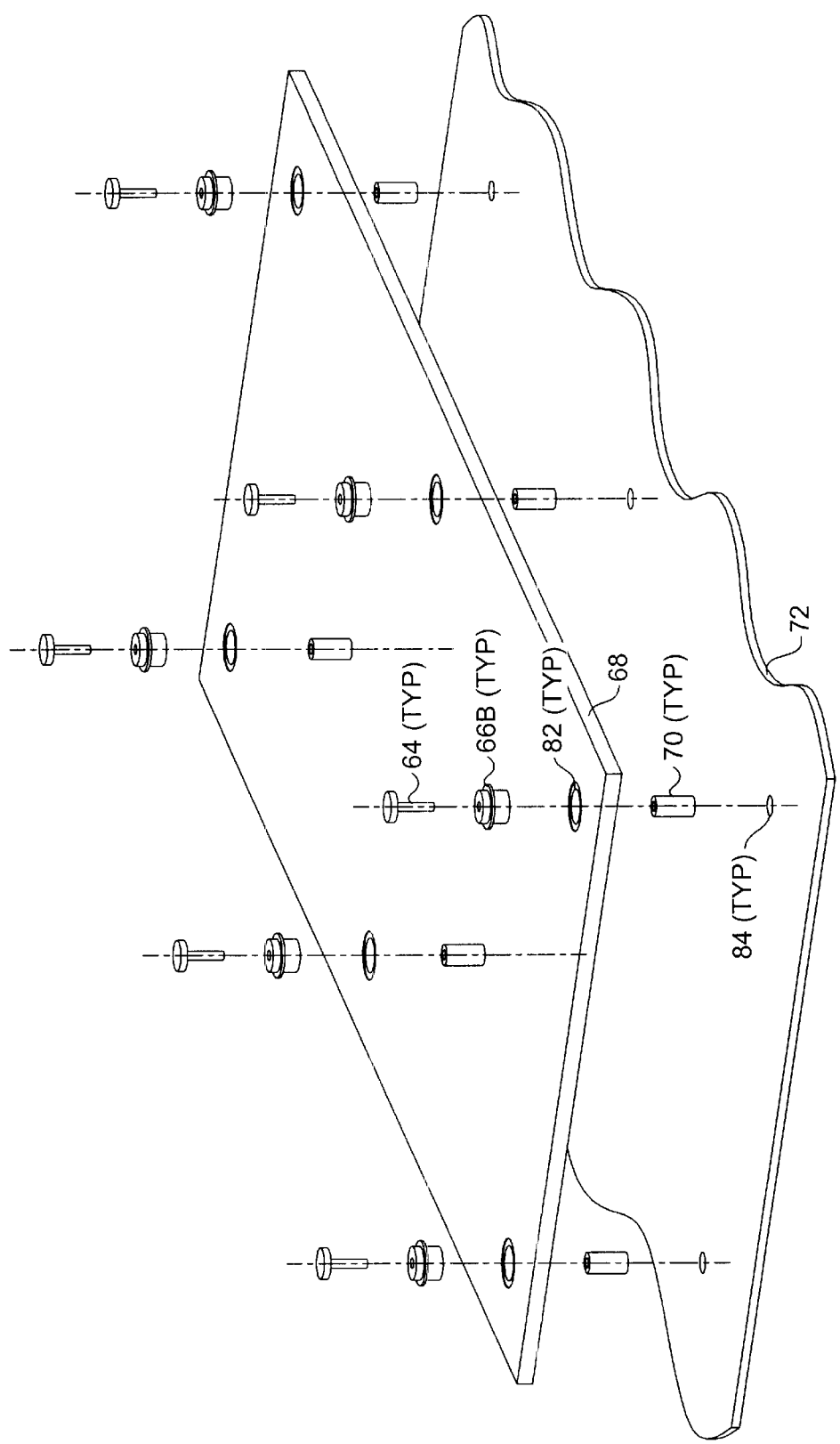
FIG. 9 is an exploded assembly view illustrating the assembly components of the third exemplary embodiment of the invention.

With reference the flowchart of FIG. 8 and FIG. 9, PCB's may be assembled to computer system chassis using the mounting schemes of embodiments 62A and 62B in the following manner. In a block 112, a plurality of solder pads are defined in the PCB. These solder pads may be produced using common PCB manufacturing methods that are well-known in the art, such as the mask/chemical etchant technique described above for forming the keepout pads.

Next, in a block 114, a plurality of holes passing through respective solder pads are defined in the PCB to form a hole pattern. In one embodiment, each of the solder pads originally comprises a circular shape that is drilled through to form an annular configuration. The flanges of the hat-section components are then solder to respective solder pads such that the centerline of each hat-section component is substantially coincident with the centerline of the hole passing though the respective solder pad in a block 116. In one embodiment, the hat-section components are placed over respective solder pads and then soldered to the PCB using a wave solder process.

In a block 118, a plurality of standoffs are secured to the chassis to form a hole pattern that is adapted to align with the hole pattern in the PCB. In one embodiment, standoff 70 includes a knurled surface or splined surface portion that is press fit into appropriately-sized holes defined in chassis 20.

The PCB is then assembled to the chassis by positioning the PCB such that an upper portion of each standoff is disposed within the major diameter portion of a respective hat-section component in a block 120 and threading respective fasteners into the internal threads of the standoffs in a block 122.

Although the present invention has been described in connection with a preferred form of practicing it and modifications thereto, those of ordinary skill in the art will understand that many other modifications can be made to the invention within the scope of the claims that follow. Accordingly, it is not intended that the scope of the invention in any way be limited by the above description, but instead be determined entirely by reference to the claims that follow.

What is claimed is:

1. A printed circuit board (PCB)-to-chassis mount comprising:
    an internally-threaded standoff, adapted to be fixedly secured to a chassis upon assembly;
    a PCB subassembly, comprising:
        a PCB, having a hole defined therein through which a portion of the internally-threaded standoff passes through upon assembly; and
        a hat-section component, having a counterbore defined therein including a major diameter portion adapted to receive a portion of the internally threaded standoff, a minor diameter portion, and a shoulder, and a flange disposed about a lower periphery thereof that is fixedly secured to the PCB such that the counterbore is substantially coincident with the hole in the PCB and the shoulder of the counterbore is disposed above a top surface of the PCB; and a threaded fastener that is threaded into the internally-threaded standoff upon assembly,
    wherein, upon assembly, a head portion of the threaded fastener is in contact with a top end of the hat-section component and a shank portion of the threaded fastener passes through the counterbore, and the shoulder of the counterbore is in contact with an upper end of the internally threaded standoff such that the PCB is indirectly coupled to the internally-threaded standoff via the hat-section component.

2. The PCB-to-chassis mount of claim 1, wherein the PCB further includes a solder pad having a hole therethrough coincident with the hole in the PCB to which the flange of the hat-section component is soldered during a manufacturing operation.

3. The PCB-to-chassis mount of claim 2, wherein the solder pad has an annular configuration.

4. The PCB-to-chassis mount of claim 2, wherein each of the internally threaded standoff, the hat-section component, the threaded fastener, and the chassis are made of conductive materials such that the solder pads are electrically coupled to the chassis upon assembly.

5. The PCB-to-chassis mount of claim 1, wherein the internally-threaded standoff is fixedly secured to the chassis using a precision press-fit operation such that an assembled distance between the PCB and the chassis is precisely controlled.

6. A printed circuit board (PCB)-to-chassis mount comprising:

an internally-threaded standoff, adapted to be fixedly secured to a chassis upon assembly;

a PCB, having a hole defined therein through which a portion of the internally-threaded standoff passes through upon assembly;

a skirted hat-section component, having a counterbore defined therein including a major diameter portion adapted to receive a portion of the internally threaded standoff, a minor diameter portion, and a shoulder, a flange disposed about a middle periphery thereof that is fixedly secured to the PCB such that the counterbore is substantially coincident with the hole in the PCB and a skirt that extends below the flange, having an outer diameter adapted to be received by the hole in the PCB;

a threaded fastener that is threaded into the internally-threaded standoff upon assembly, wherein, upon assembly, the shoulder of the counterbore is disposed above a top surface of the PCB and a head portion of the threaded fastener is in contact with a top end of the skirted hat-section component and a shank portion of the threaded fastener passes through the counterbore, and the shoulder of the counterbore is in contact with an upper end of the internally threaded standoff such that the PCB is indirectly coupled to the internally-threaded standoff via the skirted hat-section component.

7. A method for securing a printed circuit board (PCB) to a chassis, comprising:

defining a plurality of holes in the PCB configured in a first hole pattern;

fixedly securing a plurality of hat-section components to the PCB, each hat-section component having a counterbore defined therein including a major diameter portion, a minor diameter portion, and a shoulder, and a flange disposed about a lower periphery thereof, each of said hat-section components aligned with a respective hole in the PCB such that its counterbore is substantially coincident with the hole and the shoulder of the counterbore is disposed above a top surface of the PCB;

fixedly securing a plurality of internally-threaded standoffs to the chassis so as to define a second hole pattern substantially coincident with the first hole pattern;

positioning the PCB relative to the chassis such that an upper portion of each internally-threaded standoff is disposed within the major diameter portion of a respective hat-section component counterbore; and threading a respective threaded fastener into each internally threaded standoff such that a head portion of the threaded fastener is in contact with a top end of a respective hat-section component and a shank portion of the threaded fastener passes through the counterbore of the respective hat-section component, and the shoulder of the counterbore is in contact with an upper end of a respective internally threaded standoff such that the PCB is indirectly coupled to the internally-threaded standoff via the hat-section component.

8. The method of claim 7, further comprising:

defining a plurality of solder pads on an upper surface of the PCB, each solder pad having a hole defined therein that is coincident with a respective hole in the PCB; and soldering the flange of a respective hat-section component to each solder pad to fixedly secure the hat-section components to the PCB.

9. The method of claim 8, wherein each of the flange and solder pad comprises an annular configuration.

10. The method of claim 8, wherein each of the internally-threaded standoff, the hat-section component, the threaded fastener, and the chassis are made of conductive materials such that the solder pads are electrically coupled to the chassis upon assembly.

11. The method of claim 7, wherein each of the internally-threaded standoffs is fixedly secured to the chassis using a precision press-fit operation such that a assembled distance between the PCB and the chassis is precisely controlled.

12. A method for assembly a printed circuit board (PCB) to a chassis, comprising:

defining a plurality of holes in the PCB configured in a first hole pattern;

fixedly securing a plurality of skirted hat-section components to the PCB, each skirted hat-section component having a counterbore defined therein including a major diameter portion, a minor diameter portion, and a shoulder, a flange disposed about a lower periphery thereof, and a skirt extending downward from the flange, each of said hat-section components aligned with a respective hole in the PCB such that its counterbore is substantially coincident with the hole and its skirt is disposed within the respective hole;

fixedly securing a plurality of internally-threaded standoffs to the chassis so as to define a second hole pattern substantially coincident with the first hole pattern;

positioning the PCB relative to the chassis such that an upper portion of each internally-threaded standoff is disposed within the major diameter portion of a respective hat-section component counterbore; and threading a respective threaded fastener into each internally threaded standoff such that a head portion of the threaded fastener is in contact with a top end of a respective skirted hat-section component and a shank portion of the threaded fastener passes through the counterbore of the respective hat-section component, and the shoulder of the counterbore is in contact with an upper end of a respective internally threaded standoff.

\* \* \* \* \*